United States Patent
Kerdiles et al.

(10) Patent No.: US 7,189,632 B2
(45) Date of Patent: Mar. 13, 2007

(54) MULTIFUNCTIONAL METALLIC BONDING

(75) Inventors: Sèbastien Kerdiles, Saint-Ismier (FR); Fabrice Letertre, Grenoble (FR); Christophe Morales, Pont de Claix (FR); Hubert Moriceau, Saint Egrève (FR)

(73) Assignees: S.O.I.Tec Silicon on Insulator Technologies S.A., Bernin (FR); Commissariat à l'Energie Atomique (CEA), Paris (FR)

( * ) Notice: Subject to any disclaimer, the term of this patent is extended or adjusted under 35 U.S.C. 154(b) by 0 days.

(21) Appl. No.: 10/744,867

(22) Filed: Dec. 22, 2003

(65) Prior Publication Data
US 2005/0048739 A1 Mar. 3, 2005

(30) Foreign Application Priority Data
Sep. 2, 2003 (FR) .................. 03 10369

(51) Int. Cl.
*H01L 21/30* (2006.01)
*H01L 21/46* (2006.01)

(52) U.S. Cl. ...................... 438/458; 438/455

(58) Field of Classification Search ............... 438/107, 438/109, 110, 118–119, 406, 455, 458, 929; 257/685, 686, 723
See application file for complete search history.

(56) References Cited

U.S. PATENT DOCUMENTS

| 6,335,263 B1 | 1/2002 | Cheung et al. | 438/455 |
| RE38,466 E | 3/2004 | Inoue et al. | 438/30 |
| 2001/0055854 A1* | 12/2001 | Nishida et al. | 438/455 |
| 2002/0014630 A1 | 2/2002 | Okazaki et al. | 257/79 |
| 2002/0131682 A1* | 9/2002 | Nasiri et al. | 385/18 |
| 2003/0168664 A1 | 9/2003 | Hahn et al. | 257/79 |
| 2004/0058537 A1* | 3/2004 | Yanagita et al. | 438/689 |

FOREIGN PATENT DOCUMENTS

| EP | 0 858 110 A1 | 8/1998 |
| EP | 1 168 460 A2 | 1/2002 |
| WO | WO 01/91195 A1 | 11/2001 |

OTHER PUBLICATIONS

Klaus Streubel et al., XP-001143524, "High Brightness AlGaInP Light-Emitting Diodes", IEEE Journal on Selected Topics in Quantum Electronics, vol. 8, No. 2, pp. 321-332 (2002).
Takashi Mukai, XP-001143516, "Recent Progress in Group-III Nitride Light-Emitting Diodes", IEEE Journal on Selected Topics in Quantum Electronics, vol. 8, No. 2, pp. 264-270 (2002).

* cited by examiner

*Primary Examiner*—Zandra V. Smith
*Assistant Examiner*—Thanh Y. Tran
(74) *Attorney, Agent, or Firm*—Winston & Strawn LLP

(57) ABSTRACT

Methods are provided for producing a transfer layer of a semiconductor material on a final substrate. In some embodiments, the transfer layer is produced on the final substrate by forming a layer of semiconductor material on an initial support, assembling that layer and a final substrate by metal bonding, and mechanically separating the initial support from the layer at a weak interface that initially attached the layer to the initial support. An intermediate substrate can be obtained which can be used to fabricate a variety of components such as light-emitting diodes or laser diodes. These techniques can produce a transfer layer on a final substrate and a recyclable initial support that can be detached from the transfer layer for recycling by dint of non-destructive mechanical release.

23 Claims, 2 Drawing Sheets

MULTIFUNCTIONAL METALLIC BONDING

BACKGROUND

The present invention relates to the field of assembling transfer layers and substrates. In particular, it is applicable to the production of light-emitting diodes (LEDs) or laser diodes (LDs) using layer transfer by metal bonding.

The active layers of LEDs and LDs emitting in green, blue or ultraviolet (constituted, for example, by GaN or AlGaInN alloys) are usually grown epitaxially on sapphire or SiC substrates (see, for example, IEEE Journal On Selected Topics in Quantum Electronics, 8 (2002), 264, T. Mukai, "Recent progress in group-III nitride light emitting diodes", or Phys. Stat. Sol. (a) 180 (2000) 5, V. Härle et al., "GaN-based LEDs and lasers on SiC"), while the active layers of LEDs or LDs emitting in the red, orange or yellow (constituted, for example, by GaAs or AlGaInP alloys) are essentially grown epitaxially on GaAs or InP substrates. (See, for example, IEEE Journal on Selected Topics in Quantum Electronics 8 (2002) 321, K. Streubel et al., "High brightness AlGaInP light emitting diodes"). These substrates are typically bulk substrates and are selected principally for their physical properties, such as their lattice parameters and thermal coefficient of expansion suitable for the growth of active layers by epitaxy.

However, substrates such as silicon or certain metals would be preferred for the operation of the final device because of better thermal conductivity (dissipation of heat produced by LEDs or LDs in operation) and better electrical conductivity (for example, for establishing good electrical contact with the back face of the device, which is positioned opposite to the face of the device that is used to extract emitted light) provided by such substrates.

One known way of benefiting from those two types of substrates and their combined advantages consists of growing the active layers of the device on a first type of substrate (e.g., sapphire, SiC or GaAs) and transferring that prefabricated device, by metal bonding, to a substrate adapted for the final steps of its fabrication and, in particular, to its optimum function. The transfer can be divided into two critical steps involving metal bonding of a final support to the active layers epitaxially grown on the initial substrate, and removal of the initial substrate.

One known technique for the removal of the initial support is a laser lift-off separation technique, which is described in U.S. Pat. No. 6,071,795. That technique consists of using a laser to disintegrate the interface separating the initial substrate from a first thin layer reposing on the initial substrate. The laser is used to illuminate the starting structure from its back face. The disintegrated interface releases the thin layer from the initial support. This technique is limited to starting structures comprising an initial surface that is transparent to the laser beam and a first thin layer that absorbs the laser light. The only application of this technique appears to be that of forming a thin layer of GaN epitaxially grown on sapphire.

U.S. Pat. No. 6,335,263, which is incorporated herein by reference in its entirety, discloses the use of a stack based on In and Pd to bond an LED structure based on GaN to a Si or GaAs substrate at 200° C. The starting sapphire substrate is removed by laser separation. The Pd—In stack is unsuitable for mechanical release of the initial support substrate because of its poor mechanical strength. Further, the PdIn$_3$ layer formed does not constitute a good mirror for LED light.

Other known means for removing the initial support consist of mechanical thinning (grinding or lapping) or chemical etching or a combination of mechanical thinning with chemical etching. These methods remove the initial support to transfer the active layer of a particular device, but also destroy the initial support at the same time.

Mechanical thinning can be particularly difficult with fragile substrates such as GaAs, and is lengthy in duration for hard substrates such as SiC, GaN, AlN or sapphire. Chemical attack is also lengthy in duration and is limited to substrates for which a solution (an acid) exists which can selectively etch the support and not the active layers epitaxially grown thereon. GaAs and Si are almost the only examples of an initial support that falls into this category. Selective chemical etching of GaN, SiC, AlN and sapphire presently appears to be impossible.

As an example, the K. Streubel et al. article mentioned above discloses the use of an AuSn alloy to carry out metal bonding at 350° C. of GaAs-based LED structure to a Si substrate. The initial GaAs substrate, in many cases subsequently chemically etched, is not recyclable because it is destroyed during the process.

In methods for fabricating LEDs developed by the Visual Photonics Epitaxy Co (which, for example, are described in U.S. Pat. No. 6,287,882), an AuBe alloy is used for metal bonding. This method is also uneconomical because the initial substrate is removed by chemical etching during the processing technique, and is therefore, not available for recycling.

Another known technique is shown in PCT Publication No. WO-A-02/33760, which is incorporated herein by reference in its entirety. This PCT publication shows a method of producing LEDs on a composite substrate. In this technique, releasing methods include chemical etching (destruction of the initial support), which is suitable for GaAs and Si but not for SiC, GaN or sapphire, and laser separation, which is limited to a transparent substrate such as sapphire and is unsuitable for Si and SiC supports.

In the method described in that document, motifs are produced in the active layers prior to application of the final support. The particular processing step of producing motifs by a combination of photolithography and etching is complex, expensive and renders the structure ensemble weak. In such techniques, the motifs result in establishing prime rupture zones. Solutions given in WO-A-02/33760 are thus not universal (e.g., not a solution for SiC supports), and not inexpensive because recycling can only be envisaged with a sapphire support that is removed by laser separation. In addition, mechanical release is excluded by the type of structure proposed in WO-A-02/33760 because the motifs render the structure of the active layers too weak for that treatment.

Further, that document also discloses the presence of a metallic mirror layer to ensure electrical contact, and it may create deficiencies through the diffusion of metals into the active layers of the LED.

A further known means for removing an initial substrate consists of detaching or mechanically releasing a structure produced by epitaxial growth on a substrate, e.g., a substrate formed from a support and a thin layer that weakly adheres to the support. Several types of mechanically releasable substrates can be envisaged. Such techniques are, for example, described in PCT publication WO02/084622 and U.S. published application No. US2003077885, both of which are expressly incorporated herein in their entireties by reference thereto.

That approach, necessitating the use of a releasable initial substrate, is relatively universal with respect to the nature of the initial substrate and also allows the initial support to be recycled after release. This approach is not limited to transparent substrates (as is the case with laser separation) or to materials that can be chemically etched. Once the active layers are separated from the initial support, the initial support can be recycled and used again as a releasable substrate for epitaxial growth. However, the stresses inherent to mechanical release of the starting substrate require a strong bond between the active layers and the final substrate to prevent a fracture from occurring.

Therefore, a problem exists with respect to providing a method of producing a thin layer on a final substrate from a starting substrate which allows the latter to be recycled (regardless of the nature), by dint of non-destructive mechanical release.

Regarding the device itself, there is currently no known combination of layers between the final substrate and the active layers having for example the properties of ohmic contact, optical reflectivity and optionally electrical conductivity and/or mechanical strength. The present invention now seeks to overcome these problems.

SUMMARY OF THE INVENTION

In accordance with the principles of the present invention, methods for producing a layer of a semiconductor material on a substrate termed the final substrate are provided. The layer of semiconductor material is transferred from an initial support to the final support using metal bonding and using mechanical release of the initial support. This transfer layer is sometimes referred to herein as a film, a thin film, a thin layer, or simply as a layer. For convenience, however, the term transfer layer is primarily used to refer to such structures. As such, the transfer layer may be a layer of semiconductor material on an initial support (e.g., a wafer) wherein the transfer layer has a weak interface with the initial support. To assemble the layer and the final support, the two structures are metal bonded. The initial support can be mechanically separated from the transfer layer at the weak interface once the transfer layer and the final support.

The initial support may comprise a surface film on which the transfer layer is formed (e.g., using epitaxial growth) and a mechanical support. The initial support is considered releasable because of the presence of a weak interface between the transfer layer and the mechanical support.

An intermediate substrate may also be provided comprising a substrate and a thin layer of a semiconductor material connected via a metal bond. The intermediate substrate can then be used for the fabrication of a variety of components and in a variety of manners, in particular for the production of LEDs or laser diodes. In particular, contact pins can be formed on the thin layer of semiconductor material after the mechanical separation step. These pins can be transparent and may or may not cover the entire surface of the layer of semiconductor material.

BRIEF DESCRIPTION OF THE DRAWINGS

Further features of the invention, its nature and various advantages will be more apparent from the following detailed description, taken in conjunction with the accompanying drawings in which like reference characters refer to like parts throughout, and in which.

DETAILED DESCRIPTION OF PREFERRED EMBODIMENTS

Figure 1A:
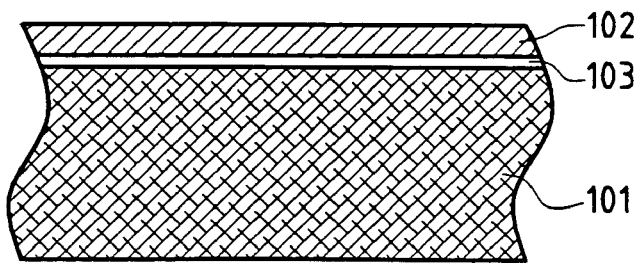
FIGS. 1A to 1F are diagrams illustrating processing techniques and structures in accordance with embodiments of the present invention.

Metal bonding is preferably used to bond the transfer layer and the final substrate. Metal bonding is considered to be sufficiently strong mechanically and compatible with the subsequent step of separation at the weak interface without resulting in mechanical damage to the metal bonding interface and without destroying the initial support.

Metal bonding is advantageously achieved, for example, using a stack of layers comprising at least one ohmic contact layer formed directly on the epitaxially grown layer of semiconductor material, a reflective layer, and a layer based on gold or aluminum. The reflecting layer (mirror) is preferably based on silver, aluminum, rhodium, platinum, or gold. A supplemental layer can also be provided to act as a diffusion barrier, which can preferably be based on tungsten, titanium, chromium, platinum, or tantalum.

Metal bonding can be carried out using a metallic deposit formed on the transfer layer, the final substrate, or both. The final substrate can, for example, be a silicon substrate or a conductive substrate coated with a film of silicon.

After forming the metal deposit, assembly of the transfer layer and the final support comprises bringing the surfaces to be bonded into contact and applying heat treatment to form a eutectic phase. For example, silicon on the surface of the final support and gold or aluminum which is deposited as a thin layer, at least, on the transfer layer of semiconductor material, can be bonded via eutectic phase. The formation of an Au—Si or Al—Si alloy provides good mechanical strength for the desired metal bond between the transfer layer and the final substrate.

The stack of metallic layers ensures good thermal and electrical conduction between the final substrate and the transferred layer of semiconductor material.

Mechanical separation, for example, through detachment following metal bonding comprises separation along the weak interface which is initially present between the transfer layer and the initial support.

In accordance with one feature of the invention, the semiconductor material of the thin layer is an $Al_xGa_{1-x-y}In_yP$ or $Al_xGa_{1-x-y}In_yN$ alloy in which $0 \leq x \leq 1$ and $0 \leq y \leq 1$ and $x+y=1$.

Techniques and structures for transferring a layer of one semiconductor material to a support of a potentially different semiconductor material via metal bonding followed by detachment of the layer from an initial support are illustratively shown in connection with FIGS. 1A to 1F. An example of an initial substrate is illustratively shown in FIG. 1A. The substrate shown therein is releasable (e.g., detachable) and comprises surface film 102 that acts as a support for epitaxial growth and is connected to support 101 via a weak interface or buried zone. This interface, which can be released mechanically, is designated by reference number 103. The weak interface allows for the non-destructive release of the substrate.

Weak interface 103 results, for example, from implanting ionic or atomic species as described, for example, in PCT publication WO02/084722 or in U.S. Pat. No. 5,374,564, or by porosification as described in U.S. Pat. No. 6,418,999, or by controlling the hydrophilic nature and roughness of the surfaces in contact at the weak zone, as described in U.S. Pat. No. 6,020,252: each of these documents are expressly incorporated herein in their entirety by reference thereto.

In cases in which the active layers to be deposited are based on AlGaInN-type alloys, surface layer 102 may preferably be a layer of SiC or sapphire or Si, AlN or GaN. In contrast, if the active layers are based on AlGaInP-type materials, the surface layer is preferably formed from GaAs, Si, or InP. In all cases, the surface layer is preferably monocrystalline.

Figure 1B:
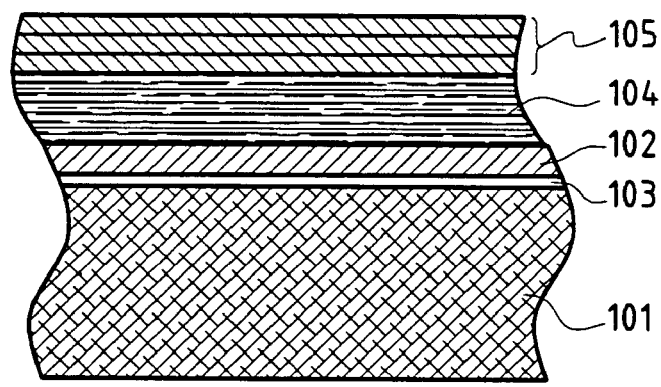

After forming active layers 104 by epitaxial growth, a first series of metallic deposits 105 is produced on top of active layers 104 (FIG. 1B). This first metallic stack can optionally be divided into a plurality of thin films of different nature.

The metal layer directly in contact with the active layers is, for example, a very thin layer (e.g., having a thickness in the range of approximately 1 nanometer (nm) to 50 nm) that ensures both good mechanical adhesion (keying layer) and good ohmic contact with the semiconductor of the last active layer (low contact resistance). For example, if the last active layer is constituted by p-type GaN, the contact is preferably the stack of Ni (at approximately 5 nm) and Au (at approximately 5 nm) or a layer of Pt (at approximately 50 nm). If, however, it is constituted by p-type GaAs, a Zn/Au, Zn/Pd or Ti/Pt type contact would be suitable. Establishing good ohmic contact on active layers 104 may necessitate heat treatment after application of the ohmic contact layer and prior to the metal bonding step.

If desired, a reflective layer (mirror) is deposited above the ohmic contact layer and is preferably based on: Ag, Al or Rh to produce a mirror in a spectral region such as the ultraviolet and/or blue and/or green, or Au, Ag, Al, Rh or Pt to produce a mirror in a spectral region such as yellow and/or orange and/or red and/or the infrared. Depending on the semiconductor constituting the last active layer, it may be that the ohmic contact is of the same nature as the reflective layer. For example, an ohmic contact on p-GaAs constituted by zinc and gold (Zn/Au), a mirror layer constituted by gold (Au), wherein the mirror layer is deposited in the continuity of the ohmic contact.

A diffusion barrier can also be established to limit the diffusion of metallic elements towards the active layers. Without taking this precaution, such unwanted diffusion would result in reducing the service life of the components produced. The barrier can be placed directly above the mirror deposited during the previous step, or it can be integrated into the ohmic contact if it is sufficiently thin. It is preferably produced based on W, Ti, Cr, Pt or Ta (e.g., in pure form and/or in a nitrided phase such as, TiN, WN, etc).

The metal stack that is deposited can, for example, be terminated by a layer allowing strong bonding, namely a layer based on gold (or aluminum).

A further series of metal deposits may be applied to final support, preferably constituted by silicon, or by a conductive substrate coated with silicon.

A thin layer of Ti, Cr (with a thickness approximately in the range 1 nm to 50 nm, for example) can then be directly applied to the deoxidized surface of the final support to ensure good adhesion and thus good mechanical behavior. A further layer of gold (or aluminum) can then finally be deposited with a view to metallic bonding. The nature of metallic deposits 106 is selected to ensure ohmic electrical contact with final support 107.

Figure 1C:
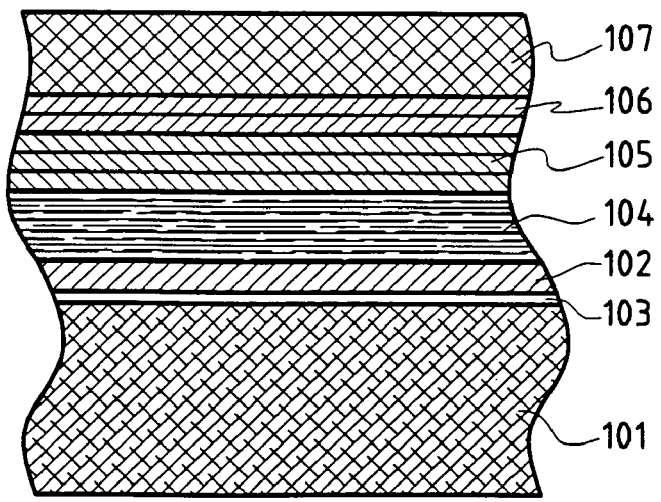

In FIG. 1C, a metal bonding step is performed during which the two metallized supports are brought into contact and bonded to each other, for example by application of a heat treatment that may be carried out in a controlled atmosphere (vacuum, inert atmosphere, etc) and under mechanical pressure to reinforce the bond. The two supports are preferably bonded by the formation of a eutectic phase, for example Au—Si, in which the gold can be that of the metallization adjacent to one or the other of the supports and the silicon may be diffused from final support 107 that is entirely constituted by Si or has a deposit of Si at its surface. Eutectic Al—Si bonding, for example, can also be used despite the high temperature required:

$$T_{eutectic}(Al—Si)=580°\ C.<T_{eutectic}(Au—Si)=363°\ C.$$

In such Al—Si Eutectic bonding, care should be taken so that the surfaces coated with aluminum do not oxidize before coming into contact.

Figure 1D:
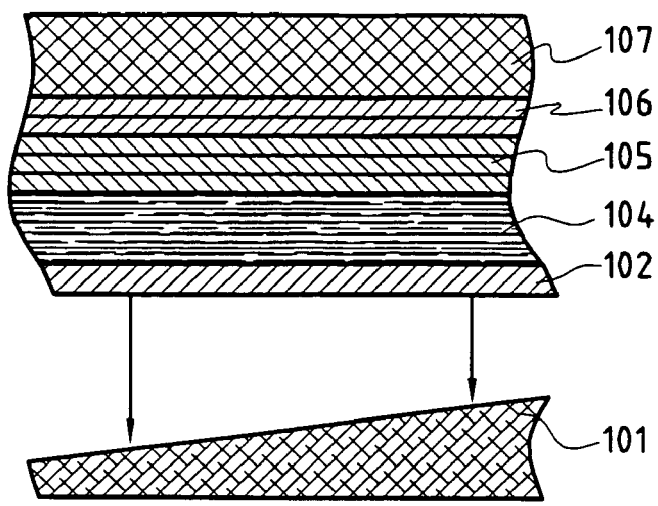
Figure 1E:
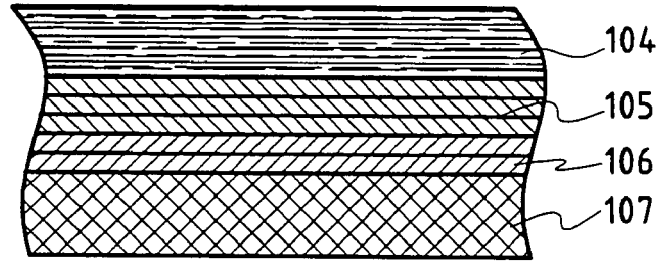

Initial support 101 can then be detached as shown in FIG. 1D. The releasable substrate is released by detachment at weak interface 103. As a result of detachment, the initial support is not destroyed and thus can be recycled to act again as a base for a new releasable substrate. A preferred form of release consists of introducing a thin blade at the weak interface between the initial support and the active layers. Under the stress of said blade, a fracture propagates preferentially along weak interface 103. The opening can also be assisted by a jet of fluid (inert or corrosive gas, water, etc).

A further form of release consists of applying a tensile force to the structure following metal bonding, for example by progressively distancing the initial support from the final support using grips and vacuum aspiration.

Prior to releasing, chemical cleaning can be used (e.g., using HF acid, aqua regia solution, etc.) to facilitate mechanical releasing.

Following release, film 102, which was used as the starting surface for epitaxial growth and optionally used as a portion of active layers 104, can be removed by chemical-mechanical polishing or by chemical etching (e.g., applicable to a film of GaAs, Si), by plasma etching, or by ion beam etching (adapted to the majority of materials constituting the film 102, including inert and hard materials such as GaN, SiC, sapphire, AlN, etc). This etching step allows epitaxially grown active layers 104 to be trimmed.

As a result, an intermediate substrate can be obtained that can be used for the fabrication of LEDs or LDs or for solar cells or for photoreceptors. This product (FIG. 1E) has the advantage of allowing the fabrication of a variety of components in a variety of manners.

Figure 1F:
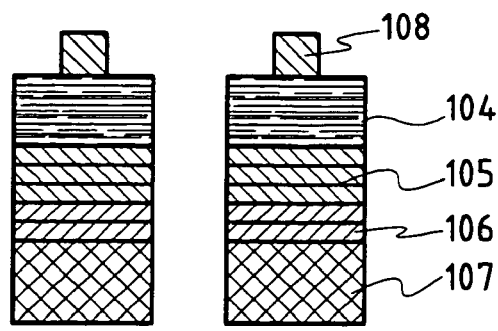

One possible route for producing such component consists of depositing an ohmic contact 108 on the face of the intermediate substrate that is free of active layers (FIG. 1F). If semiconductor 104, which was denuded by etching, is n-type GaN, the contact is preferably a Ti/Al stack or a transparent oxide conductor (for example: In$_2$O$_3$ Sn, alloys of ZnO and In$_2$O$_3$). However, if the semiconductor is n-type GaAs, the contact is preferably a AuGe/Au stack. The face on which the contact is deposited is the face for extracting the light emitted by the component. As such, the contact is preferably transparent and/or does not coat the entire surface.

The techniques described above have many advantages. Initial support 101, which may be very expensive, can be used for epitaxial growth without being destroyed and can be recycled. Mechanical release detaches any type of support, including SiC, GaN, for which chemical etching is impossible and plasma or ion beam etching is very lengthy. Detaching the initial support mechanically is not limited to transparent materials, as is the case with lift-off laser separation techniques and is also not limited to materials that are reactive to chemical attacks: it can be a universal and inexpensive release means. The different metal layers used have desired properties that can ensure both the functions of an ohmic contact and a mirror, can establish good thermal conduction and electrical conduction between the support and the active layers without losing performance due to uncontrolled diffusion phenomena, and can provide excellent mechanical behavior because of the strong materials selected.

Some particular examples of implementations of the techniques of the present invention follow. A first example involves the production of LEDs emitting in blue-UV light based on AlGaInN. A releasable substrate used in this example is composed of support 101 formed from polycrystalline SiC or silicon and an epitaxially grown surface layer 102 that is formed from 6H—SiC. Between these two portions lies a buried layer of oxide and weak interface 103. Active layers based on GaN and AlGaInN alloys are formed, for example, by epitaxial growth on film 102. Metal deposits 105 are then successively deposited on the active layers. Metal deposits 105 may be formed comprising, Ni (having a thickness of about 5 nm) and Au (having a thickness of about 5 nm) to provide ohmic contact to a p-layer, Pt to provide a diffusion barrier, Ag to form a mirror layer, and Au for bonding purposes. Final support 107 may be prepared (e.g., simultaneously) for eutectic bonding by means of metallization, such as by forming a keying layer (e.g. Cr at a thickness of about 5 nm) and forming bonding metallization (e.g., Au).

The metallized substrates are brought into contact under vacuum and heated to a temperature of close to 400° C. under a slight mechanical pressure, which is applied using a piston (P<2 bar), to bond the surfaces. As a result, a eutectic phase based on gold and silicon is formed, which establishes a strong bond between the substrates.

After cooling, the bonded wafers are detached from each other using a thin blade introduced at the weak interface. Following detachment, film 102 of 6H—SiC can be removed by reactive ion etching (RIE). Ohmic Ti/Al contact may be produced on the n-GaN layer that has been denuded by etching in accordance, for example, with the geometry illustratively shown in FIG. 1F.

Another example involves the production of an intermediate substrate for the fabrication of LEDs or LDs emitting in red that are based on AlGaInP. A releasable substrate used in this example is composed of support 101 formed from Si and an epitaxially grown surface layer 102 formed from GaAs. Between these two portions lies a buried layer of oxide and the weak interface. Active layers based on GaS and AlGaInP alloys are formed, for example, by epitaxial growth on the GaAs film. Metal deposits are then successively deposited on the active layers: Au/Zn (ohmic contact to p-layer), Ti (diffusion barrier), Au (layer forming mirror and permitting bonding).

Final support 107 may be prepared (e.g. prepared at the same time) for eutectic bonding by means of metallizations, such as metallization to form Ti (of approximately 5 nm) (keying layer) and Au (for bonding).

The metallized substrates are brought into contact under vacuum and heated to a temperature of close to 400° C. under a slight mechanical pressure applied using a piston (P<2 bar). A eutectic phase based on gold and silicon can be formed as a result to establish a strong bond. After cooling, the bonded wafers are detached from each other using a thin blade introduced at the weak interface assisted by injection of a fluid. Film 102 of GaAs may be removed by chemical etching. A composite substrate is then obtained with active layers that are compatible with the fabrication of high performance LEDs or LDs since a mirror ohmic contact was already integrated over the whole surface of the active zone such as to provide reflection of the light emitted towards the support, optimum injection of current at the back face, etc.

A further example involves the production of LEDs emitting in green that are based on GaN epitaxially grown on Si (111). A releasable substrate used in this example is composed of support 101 formed from Si and an epitaxially grown surface layer 102 formed from Si with crystallographic orientation (111). Between these two portions lies a buried layer of oxide and weak interface 103. Active layers based on GaN and AlGaInN alloys are applied to Si film 102 or are applied via a buffer layer based on AlN. Metal deposits are then successively deposited on the active layers: Ni/Cr/Au (ohmic contact to p-layer, with integrated Cr diffusion barrier), and Au (mirror and bonding layer).

Final support 107 may be prepared for eutectic bonding by means of metallization, such as metallization to form Cr (of approximately 5 nm) (keying layer), and Au (bonding layer).

The metallized substrates are brought into contact under vacuum and heated to a temperature of close to 400° C. under a slight mechanical pressure applied using a piston (P<2 bar). A eutectic phase based on gold and silicon can be formed, as a result to establish a strong bond. After cooling, the bonded wafers are detached from each other using a thin blade introduced at the weak interface. Film 102 of Si may be removed by chemical etching (TMAH). The optional AlN based buffer layer could also be removed by dry etching. Finally, an ohmic Ti/Al contact 108 can be produced on the denuded n-GaN layer 104, as shown in FIG. 1F.

Thus, the production of light-emitting diodes or laser diodes, preferably based on GaN (and AlGaInN alloys) or on GaAs (and AlGaInP alloys) using a detachable initial support can be provided. In addition, the production of an intermediate substrate comprising active layers of the components mentioned above (cf FIG. 1E) can be achieved.

It is to be understood that the present invention is not to be limited to the exact configuration as illustrated and described herein. Accordingly, all expedient modifications readily attainable by one of ordinary skill in the art from the disclosure set forth herein, or by routine experimentation there from, are deemed to be within the spirit and scope of the invention as defined by the appended claims.

What is claimed is:

1. A method of producing a transfer layer of a semiconductor layer on a final substrate, which comprises:
    forming a transfer layer of semiconductor material on an initial support, wherein the transfer layer has a weak interface with the initial support;
    providing a final substrate that has a surface layer that includes silicon;
    assembling the transfer layer and final substrate by a metal bonding process which comprises providing a surface layer of metal on the transfer layer, and forming a bond between the metal surface of the transfer layer and the silicon of the final substrate to form a eutectic phase that provides a bond that is stronger than the weak interface; and
    mechanically separating the initial support from the transfer layer at the weakened interface to provide the transfer layer on the final substrate.

2. The method according to claim 1, wherein the transfer layer is formed by epitaxial growth on the initial support.

3. The method according to claim 2, wherein the initial support comprises a substrate and an epitaxially grown layer thereon, and the transfer layer comprises a further epitaxial growth layer.

4. The method according to claim 1, wherein the metal bonding comprises depositing metal on the transfer layer and on the final substrate prior to contacting the metals together.

5. The method according to claim 4, wherein the metal bonding further comprises applying a keying layer on the final substrate before depositing metal thereon.

6. The method according to claim 5, wherein the keying layer is a thin layer of titanium or chromium.

7. The method according to claim 1, wherein the metal bonding process includes applying to the transfer layer a stack of layers comprising an ohmic contact layer, a reflective layer and a surface layer based on gold or aluminum.

8. The method according to claim 7, wherein the reflective layer comprises silver, aluminum, rhodium, gold or platinum.

9. The method according to claim 7, wherein the stack of layers includes a diffusion barrier.

10. The method according to claim 9, wherein the diffusion barrier comprises tungsten, titanium, chromium, platinum, or tantalum.

11. The method according to claim 7, wherein the transfer layer includes an active layer of p-type GaAs and the stack of layers includes layers of zinc and gold, zinc and palladium or titanium and platinum.

12. The method according to claim 7, which further comprises removing the transfer layer from the final substrate.

13. The method according to claim 7, which further comprises providing a transparent ohmic contact on the final substrate.

14. The method according to claim 1, wherein the metal is gold or aluminum so that the eutectic phase is Au—Si or Al—Si.

15. The method according to claim 1, which further comprises producing contact pins on the transfer layer after the mechanical separation step.

16. The method according to claim 15, wherein the pins are transparent.

17. The method according to claim 15, wherein the pins do not cover the entire surface of the transfer layer.

18. The method according to claim 1, wherein the semiconductor material of the transfer layer is an $Al_xGa_{1-x-y}In_yP$ or $Al_xGa_{1-x-y}In_yN$ alloy in which $0 \leq x \leq 1$, $0 \leq y \leq 1$, and $x+y=1$.

19. The method according to claim 1, wherein the mechanically separating comprises detaching the initial support from the transfer layer at the weakened interface.

20. The method according to claim 19, wherein the transfer layer includes an active layer of p-type GaN and the stack of layers includes layers of nickel, gold and platinum.

21. The method according to claim 1, wherein the metal bonding comprises bringing the surfaces to be bonded together and applying heat and pressure to form the eutectic bond.

22. The method according to claim 1, wherein the weak interface is formed by implanting atomic species, by porosification or by controlling the hydrophilic nature and roughness of the surfaces in contact at the weakened interface.

23. The method according to claim 1, which further comprises conducting a chemical cleaning prior to the mechanically separating.

* * * * *